(12) United States Patent
Tsang

(10) Patent No.: US 6,909,630 B2
(45) Date of Patent: Jun. 21, 2005

(54) MRAM MEMORIES UTILIZING MAGNETIC WRITE LINES

(75) Inventor: David Tsang, Cupertino, CA (US)

(73) Assignee: Applied Spintronics Technology, Inc., Milpitas, CA (US)

(*) Notice: Subject to any disclaimer, the term of this patent is extended or adjusted under 35 U.S.C. 154(b) by 31 days.

(21) Appl. No.: 10/459,133

(22) Filed: Jun. 11, 2003

(65) Prior Publication Data

US 2004/0109339 A1 Jun. 10, 2004

Related U.S. Application Data

(60) Provisional application No. 60/431,742, filed on Dec. 9, 2002.

(51) Int. Cl.[7] .................................................. G11C 7/00
(52) U.S. Cl. ....................................... 365/158; 365/171
(58) Field of Search .............................. 365/158, 171, 365/173; 257/421, 422

(56) References Cited

U.S. PATENT DOCUMENTS

| | | |
|---|---|---|
| 5,659,499 A | 8/1997 | Chen et al. |
| 5,940,319 A | 8/1999 | Durlam et al. |
| 6,153,443 A | 11/2000 | Durlam et al. |
| 6,211,090 B1 | 4/2001 | Durlam et al. |
| 6,351,409 B1 * | 2/2002 | Rizzo et al. ............... 365/158 |
| 6,430,084 B1 * | 8/2002 | Rizzo et al. ............... 365/173 |
| 6,740,947 B1 * | 5/2004 | Bhattacharyya et al. .... 257/421 |
| 2002/0080643 A1 | 6/2002 | Ito |
| 2002/0127743 A1 | 9/2002 | Nickel et al. |

* cited by examiner

*Primary Examiner*—Vu A. Le
(74) *Attorney, Agent, or Firm*—Sawyer Law Group LLP

(57) ABSTRACT

A method and system for providing and using a magnetic random access memory are disclosed. The method and system include providing a plurality of magnetic memory cells, a first plurality of write lines, and a second plurality of write lines. The first plurality of write lines is a plurality of magnetic write lines. At least one of the plurality of magnetic lines and at least one of the second plurality of write lines each carrying a current for writing to at least one of the plurality of magnetic memory cells. Preferably, the plurality of magnetic write lines have soft magnetic properties and are preferably magnetic bit lines. For magnetic tunneling junction stacks within the magnetic memory cells, the magnetic bit lines are preferably significantly thicker than and closely spaced to the free layers of the magnetic memory cells.

37 Claims, 5 Drawing Sheets

MRAM MEMORIES UTILIZING MAGNETIC WRITE LINES

CROSS-REFERENCE TO RELATED APPLICATIONS

This application is claiming under 35 USC 119(e) the benefit of provisional patent application Ser. No. 60/431,742 filed on Dec. 9, 2002.

The present application is related to co-pending U.S. patent application Ser. No. 60/444,881 (2817P), entitled HIGH DENSITY AND HIGH PROGRAMMING EFFICIENCY MRAM DESIGN, filed on Feb. 5, 2003, and assigned to the assignee of the present application. The present application is related to co-pending U.S. patent application Ser. No. 10/606,557(2818P), entitled MRAM ARCHITECTURE AND A METHOD AND SYSTEM FOR FABRICATING MRAM MEMORIES UTILIZING THE ARCHITECTURE, filed on Jun. 26, 2003, and assigned to the assignee of the present application. The present application is related to co-pending U.S. patent application Ser. No. 10/646,455(2780P), entitled MRAM ARRAY WITH MAGNETIC WRITE LINES, filed on Aug. 21, 2003, and assigned to the assignee of the present application.

FIELD OF THE INVENTION

The present invention pertains to magnetic memories, and more particularly to a method and system for providing a magnetic random access memory (MRAM) that is preferably high density, nonvolatile and that incorporates writelines having improved writing efficiencies, ease of manufacturing, and better reliability against electromigration.

BACKGROUND OF THE INVENTION

DRAM, FLASH, and SRAM are the three major semiconductor memories on the market. Although the manufacturing cost of DRAM is the lowest, DRAM has several shortcomings. DRAM is volatile, and, therefore, loses data when the power is turned off. Furthermore, DRAM needs refreshment, has a relatively low speed and has a high power consumption. FLASH memory offers non-volatility, but its speed is very low. In addition, the write cycle endurance of FLASH memories is typically less than 1000,000 cycles. These drawbacks limit the application of FLASH memories in some high data rate markets. SRAM is a fast memory, but is volatile and takes a relatively large amount of silicon area per cell. In search of a universal random access memory that offers high speed, non-volatility, small cell area, and good endurance, thin film Magnetic Random Access Memories (MRAM) have been developed.

Conventional thin film Magnetic Random Access Memories can be fabricated with a variety of conventional memory cell types, including an Anisotropic Magnetoresistance (AMR) cell, a Giant Magnetoresistance (GMR) cell, and a Magnetic Tunneling Junction (MTJ) cell. Because the conventional MTJ cell is the easiest to manufacture and use, it will be used as the primary example throughout this disclosure. However, one of ordinary skill in the art will readily understand that these concepts also apply to other MRAM cells and arrays. The conventional MTJ cell essentially includes an MTJ stack. The MTH stack includes a pair of magnetic layers with an insulating layer sandwiched there between. One of the magnetic layers, the pinned layer, has a fixed magnetic vector (fixed magnetization). The other magnetic layer (free layer) has a changeable magnetic vector (changeable magnetization) that is stable either aligned parallel to or substantially antiparallel to the fixed magnetic vector in the pinned layer. When the magnetic vectors are aligned, the resistance of the conventional MTJ stack and thus the conventional MTJ cell, i.e. the resistance to current flow between the magnetic layers, is a minimum. When the magnetic vectors are opposed or misaligned, the resistance of the conventional MTJ cell is a maximum.

Data is stored in the conventional MTJ cell by applying a magnetic field to the conventional MTJ cell. The applied magnetic field has a direction chosen to move the changeable magnetic vector of the free layer to a selected orientation. Stated differently, the conventional MTJ cell is typically written by applying a magnetic field that can alter the direction of the magnetic vector of the free layer. Generally, the aligned orientation can be designated a logic 1 or 0, while the misaligned orientation is the opposite, i.e., a logic 0 or 1, respectively. Stored data is read or sensed by passing a current through the conventional MTJ cell from one magnetic layer to the other. The amount of current passing through the conventional MTJ cell, or the voltage drop across the conventional MTJ cell will vary according to the orientation of the changeable magnetic vector.

The magnetic field for changing the orientation of the changeable magnetic vector is usually supplied by two conductor lines that are substantially orthogonal to each other. When electrical current passes through the two conductor lines at the same time, two magnetic fields associated with the currents in the two conductor lines are generated. These two magnetic fields act on the changeable magnetic vector of the free layer to orient the direction of the changeable magnetic vector.

FIG. 1 depicts a portion of a conventional magnetic memory including conventional orthogonal conductor lines 10 and 12, conventional magnetic storage cell 11 and conventional transistor 13. The conventional magnetic storage cell 11 is located at the intersection of and between the conventional conductor lines 10 and 12. The magnetic storage cell 11 depicted in FIG. 1 is a conventional MTJ cell consisting of a conventional MTJ stack. Conventional line 10 and conventional line 12 are often referred to as the word line and the bit line respectively. The names, however, are interchangeable. Other names, such as row line, column line, digit line, and data line, may also be used.

The conventional MTJ 11 stack primarily includes the free layer 1104 with the changeable magnetic vector (not explicitly shown), the pinned layer 1102 with the fixed magnetic vector (not explicitly shown), and the insulator 1103 in between the two magnetic layers 1104 and 1102. The insulator 1103 typically has a thickness that is low enough to allow tunneling of charge carriers between the magnetic layers 1102 and 1104. Layer 1101 is usually a composite of seed layers and an anti-ferromagnetic layer that is strongly coupled to the pinned magnetic layer.

During writing, the electrical current $I_1$ flowing in the conventional bit line 12 and $I_2$ flowing in the conventional word line 10 yield two magnetic fields on the free layer 1104. In response to the magnetic fields, the magnetic vector in free layer 1104 is oriented in a direction that depends on the direction and amplitude of $I_1$ and $I_2$ and the properties and shape of the free layer 1104. Generally, writing a zero (0) requires the direction of either $I_1$ or $I_2$ to be different than when writing a one (1). During reading, the conventional transistor 13 is turned on and a small tunneling current flows through the conventional MTJ cell. The amount of the current flowing through the conventional MTJ cell 11 or the voltage drop across the conventional MTJ cell 11 is measured to determine the state of the memory cell. In some designs, the conventional transistor 13 is replaced by a diode, or completely omitted, with the conventional MTJ cell 11 in direct contact with the conventional word line 10.

Although the above conventional MTJ cell 11 can be written using the conventional word line 10 and conventional bit line 12, one of ordinary skill in the art will readily recognize that the amplitude of $I_1$ or $I_2$ is in the order of several milli-Amperes for most designs. Therefore, one of ordinary skill in the art will also recognize that a smaller writing current is desired for many memory applications.

FIG. 2 depicts a portion of a conventional magnetic memory that has a lower writing current. Similar systems are described in U.S. Pat. Nos. 5,659,499, 5,940,319, 6,211,090, 6,153,443, and U.S. patent application Ser. No. 2002/0127743. The conventional systems and conventional methods for fabricating the conventional systems disclosed in these references encapsulate bit lines and word lines with soft magnetic cladding layer on the three surfaces not facing MTJ cell 11'. Many of the portions of the conventional memory depicted in FIG. 2 are analogous to those depicted in FIG. 1 and are thus labeled similarly.

The system depicted in FIG. 2 includes the conventional MTJ cell 11', conventional word line 10' and bit line 12'. The conventional word line 10' is composed of two parts: a copper core 1001 and a soft magnetic cladding layer 1002. Similarly, the conventional bit line 12' is composed of two parts: a copper core 1201 and a soft magnetic cladding layer 1202.

Relative to the design in FIG. 1, the soft magnetic cladding layers 1002 and 1202 can concentrate the magnetic flux associated with $I_1$ and $I_2$ onto the MTJ cell 11' and reduce the magnetic field on the surfaces which are not facing the MTJ cell 11'. Thus, the sot magnetic cladding layers 1002 and 1202 concentrate the flux on the MTJ that makes up the MTJ cell 11', making the free layer 1104 easier to program. Although this approach works well theoretically, one of ordinary skill in the art will readily recognize that the magnetic properties of the portions of the soft cladding layers 1002 and 1202 on the vertical sidewalls of the conventional lines 10' and 12', respectively, are hard to control. One of ordinary skill in the art will also recognize that the process of making the conventional word line 10' and the conventional bit line 10' is complicated. The complicated fabrication methods pose significant challenge to scaling to higher densities. Accordingly it is highly desirable to provide an MRAM architecture which is scalable and easy to fabricate, and offers high writing efficiency.

Furthermore, the conventional write lines 10, 10', 12, and 12' of the conventional designs depicted in both FIG. 1 and FIG. 2 limit scalability. In these conventional designs, the conventional write lines 10, 10', 12, and 12' are mostly made of either aluminum or copper. The current density limits for aluminum and copper are in the order of $1 \times 10^6$ A/cm$^2$ or less. As the line width decreases to increase the memory density, the electromigration current density limit poses severe challenges for scaling.

Other conventional systems attempt to propose different solutions, each of which has its drawbacks. As an example, U.S. patent application Ser. No. 2002/0080643 proposed that, after a write operation, a reverse current is applied to the write lines to prevent electromigration. But such conventional methods compromise performance by reducing the speed of the memory and add complexities. Thus, it is also highly desirable to have write line made of materials with high reliability in electromigration, which will allows for easy scalability to high density memory arrays.

Conventional thin bit lines, which might be used for smaller or more efficient memories have shortcomings. Thinner conventional bit lines have higher resistances. This adversely affects the performance of the overall memory array. However, there are many conventional methods of overcoming this issue. One common practice is to break up the long bit lines in the memory array into global bit lines that are made of thick metals, and connect the global bit lines into local bit lines that are made of thinner metals, and thus have a higher resistance. Examples of such design are taught by U.S. Pat. No. 6,335,890 and U.S. patent application Ser. No. 2002/0034117. However, the other problems described above, such as the electromigration are still not overcome.

Accordingly, what is needed is a system and method for providing a scalable, efficient, low current magnetic memory. The present invention addresses such a need.

SUMMARY OF THE INVENTION

A method and system for providing and using a magnetic random access memory are disclosed. The method and system include providing a plurality of magnetic memory cells, a first plurality of write lines, and a second plurality of write lines. The first plurality of write lines is a plurality of magnetic write lines. At least one of the plurality of magnetic lines and at least one of the second plurality of write lines each carrying a current for writing to at least one of the plurality of magnetic memory cells. Preferably, the plurality of magnetic write lines have soft magnetic properties and are preferably magnetic bit lines. For magnetic tunneling junction stacks within the magnetic memory cells, the magnetic bit lines are preferably significantly thicker than and closely spaced to the free layers of the magnetic memory cells.

According to the system and method disclosed herein, the present invention provides a magnetic memory having an improved efficiency, improved reliability against electromigration, while being simpler to fabricate.

DETAILED DESCRIPTION OF THE INVENTION

The present invention relates to an improvement in magnetic memories. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

A method and system for providing and using a magnetic random access memory are disclosed. The method and system include providing a plurality of magnetic memory cells, a first plurality of write lines, and a second plurality of write lines. The first plurality of write lines is a plurality of magnetic write lines. At least one of the plurality of magnetic lines and at least one of the second plurality of write lines each carrying a current for writing to at least one of the plurality of magnetic memory cells. Preferably, the plurality of magnetic write lines have soft magnetic properties and are preferably magnetic bit lines. For magnetic tunneling junction stacks within the magnetic memory cells, the magnetic bit lines are preferably significantly thicker than and closely spaced to the free layers of the magnetic memory cells.

The present invention will be described in terms of particular types of magnetic memory cells, particular materials, and a particular configuration of elements. However, one of ordinary skill in the art will readily recognize that this method and system will operate effectively for other magnetic memory cells, and other materials and configurations non inconsistent with the present invention. For example, although MTJ stacks are described as including single magnetic layers, nothing prevents the use of other materials, other alloys and synthetic layers. One of ordinary skill in the art will also readily recognize that although the present invention are described in terms of magnetic bit lines, the method and system are consistent with the magnetic word lines, digit lines, or simply write lines.

Figure 1:
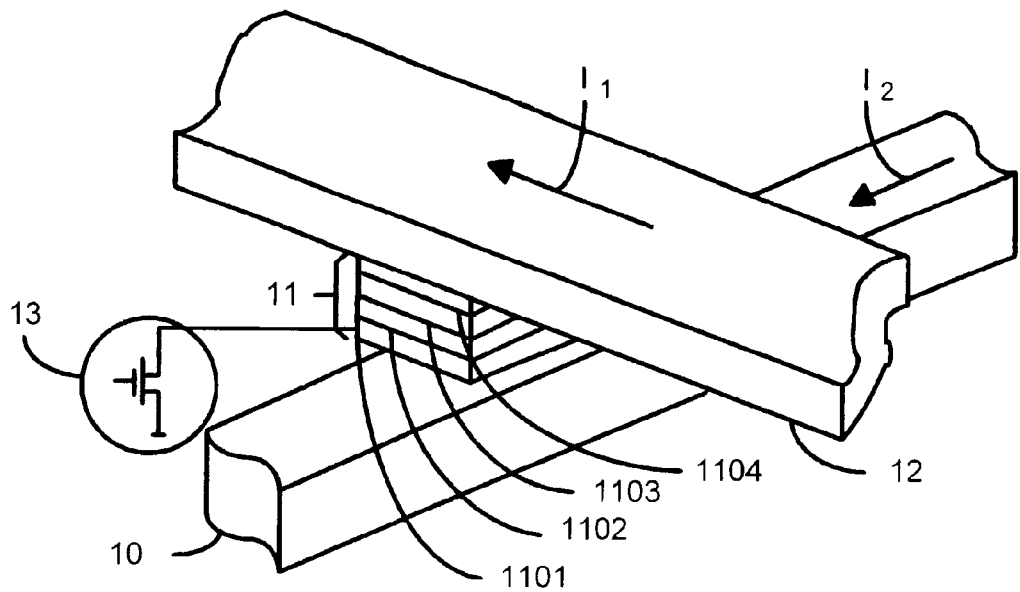
FIG. 1 is a three-dimensional view of a portion of a conventional magnetic memory including a MTJ cell, located at the intersection of a bit line and a word line.
Figure 2:
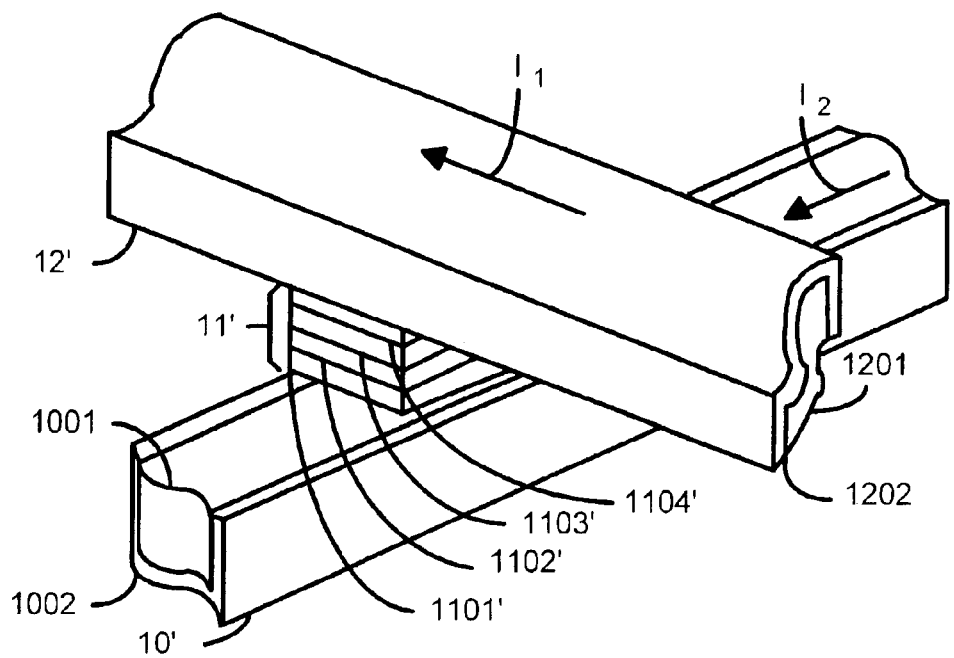
FIG. 2 is a three-dimensional view of a portion of a conventional magnetic memory including a MTJ cell, located at the intersection of a bit line and a word line, where the bit line and the word line have magnetic cladding to improve write efficiency.
Figure 3A:
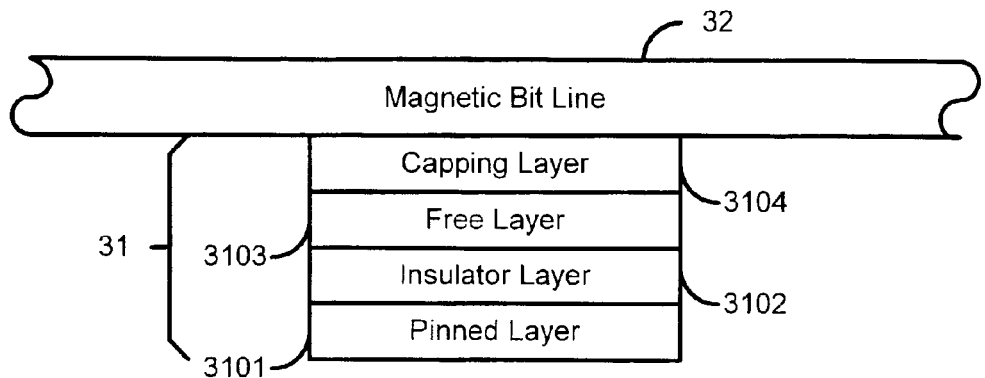
FIG. 3a, FIG. 3b, and FIG. 3c are, respectively, the side view, the cross-sectional view, and the plane view of a portion of one embodiment of a magnetic memory in accordance with the present invention including a MTJ stack in an MRAM cell with a magnetic bit line.
Figure 3B:
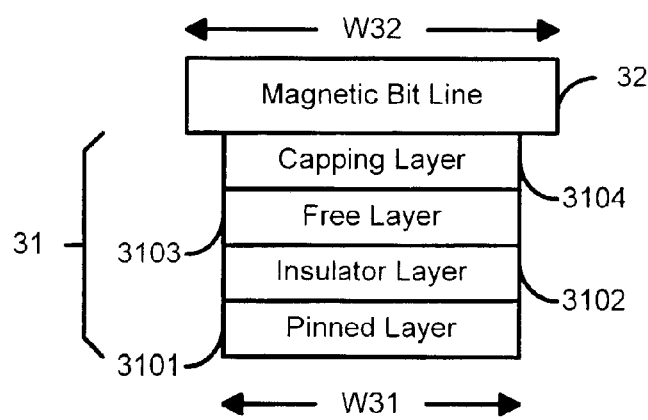
Figure 3C:
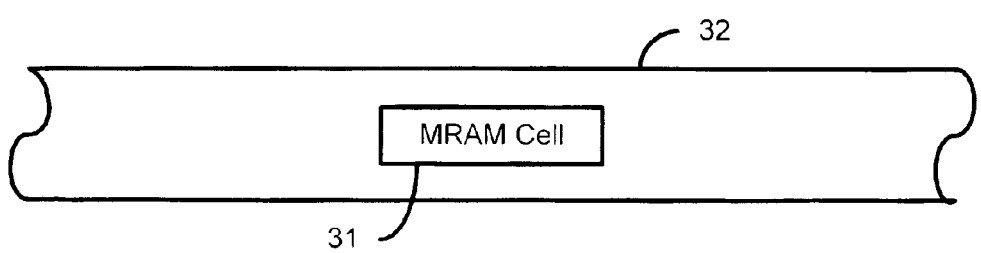

To more particularly illustrate the method and system in accordance with the present invention, refer now to FIGS. 3a, 3b and 3c, depicting a portion of one embodiment of a magnetic memory, such as an MRAM in accordance with the present invention. FIG. 3a depicts a side view of the portion of the magnetic memory in accordance with the present invention. The MRAM includes word lines (not shown), bit lines, such as the magnetic bit line 32, and MRAM cells, of which one is shown. The MRAM cell 31 shown includes a MTJ stack 31. The MTJ stack 31 includes two magnetic layers: a pinned layer 3101 and a free layer 3103. The free layer 3103 has a changeable magnetic vector, while the pinned layer 3101 has a fixed magnetic vector. The magnetic layers 3101 and 3103 are preferably made of magnetic materials such as nickel, cobalt, iron, or alloys thereof. Other elements, such as boron and nitrogen, can also be added to produce desirable magnetic properties. While the free layer 3103 and the pinned layer 3101 are shown each in the figure as a single layer, it should be clear to those of ordinary skill in the art that each layer can also be a composite of several magnetic layers. The pinned layer 3101 is often pinned by an anti-ferromagnetic layer underneath 3101, not shown here, or other means familiar to those of ordinary skill in the art.

An insulator layer 3102 separates the two magnetic layers. The insulator 3102 is preferably aluminum oxide, other oxide, or composite of two or more oxide layers. The insulator 3102 is also preferably thin enough to allow tunneling of charge carriers between the magnetic layers 3101 and 3103. Free layer 3103 is preferably capped by a metal layer 3104. In the shown, the capping layer is preferably made of high conductivity metals such as copper, gold, silver, rhodium, ruthenium, aluminum, and tantalum. If copper is used as the capping layer, cobalt-iron (not shown) is usually used as a diffusion barrier. In such case, the free layer 3103 should at least include a thin cobalt-iron layer of several angstroms on the top to prevent the diffusion of copper from the capping layer 3104 into free layer 3103. This diffusion barrier finds particular utility when nickel-iron is part of the free layer 3101.

The magnetic bit line 32 crosses the MTJ stack 31 and preferably makes contact with the metal capping layer 3104. In the present invention the bit line 32 is magnetic. A significant portion, and preferably all, of the magnetic bit line 32 is made of magnetic materials, such as nickel, cobalt, iron, or alloy thereof, such as NiFe. The magnetic material making up the magnetic bit line 32 is a soft magnetic material. In one embodiment, the core (central portion) of the magnetic bit line 32 is magnetic. In a preferred embodiment, the bulk of or all of magnetic bit line 32, except layers such as seed layers, is magnetic. The magnetic bit line 32 can further be a composite of several magnetic layers. If copper is used as the metal capping layer 3104, the magnetic bit line 32 should at least include a cobalt iron layer (not separately shown) as a diffusion barrier between the copper metal capping layer 3104 and the magnetic bit line 32. While the magnetic bit line 32 preferably is made mostly of magnetic material, the magnetic bit line 32 can also have a non-magnetic metal seed layer. However, for reasons discussed below, it is still preferred that the spacing between the magnetic portion of the magnetic bit line 32 and the free layer 3103 is approximately three hundred Angstroms or less. In a preferred embodiment, the combined thickness of the metal seed layer (not shown) and the non-magnetic capping layer 3104 of the MTJ stack 34 is still in the order of three hundred Angstroms or less.

FIG. 3b shows a cross-sectional view of the structure of the magnetic bit line 32 and the MTJ stack 31 in accordance with the present invention. The magnetic bit line 32 has a width W32. The MTJ stack 31 has a width W31. In the present invention, the magnetic bit line width W32 is preferably equal or greater than the MTJ stack width W31. In FIG. 3b, the magnetic bit line width W32 is greater than the MTJ stack width W31. However, self-aligned patterning processes can be employed to produce a substantially equal widths of the magnetic bit line 32 and the MTJ stack 31 and substantially perfect alignment between the two. In such a process, the magnetic bit line width W32 and the MTJ stack width W31 are determined in one etching process, such as ion milling.

FIG. 3c is a plane view of the embodiment of the magnetic bit line 32 and the MTJ stack 31 in accordance with the present invention. In FIG. 3c, the MTJ stack 31 is shown to have a rectangular shape having its long axis substantially aligned with the magnetic bit line 32. Thus, the MTJ stack 31 has a shape anisotropy such that the magnetic vector of the free layer 3103 lies substantially along the magnetic bit line 32 in the lengthwise direction. In the following descriptions, we will continue to assume this shape anisotropy. However, it should be noted that other shapes and other orientations of the magnetic vector of the free layer 3103 are consistent with the present invention. For example, it should be noted that the invention also works with the free layer easy axis oriented orthogonal to the bit line lengthwise direction.

Figure 4:
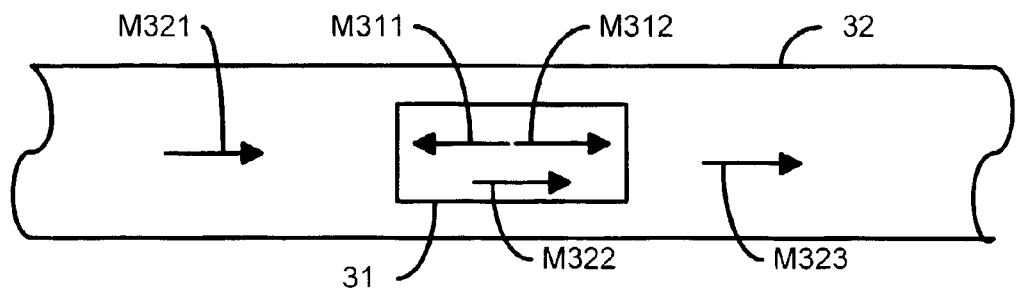
FIG. 4 is the plane view of the MTJ cell and the bit line, as well as schematic representations of the magnetic vectors of free layer of the MTJ cell and the magnetic bit line in the quiescent states for one embodiment of a magnetic memory in accordance with the present invention.

FIG. 4 is a plane view of the embodiment of the portion of the MRAM of the free layer 3103 and the magnetic bit line 32 described in FIGS. 3a, 3b, and 3c. In FIG. 4, a schematic representation of the magnetic vectors M321, M322, and M323 of the magnetic bit line 32 is shown. According to the present invention, the magnetic vectors are to orient substantially parallel to the bit line in the lengthwise direction. Also shown in FIG. 4 is the magnetic vector M311/M312 of the free layer 3103. In the quiescent state, the free layer magnetic vector M311/M312 is to lie in the easy axis direction. Consequently, for exemplary purposes, the free layer vector is shown as either M311 or M312, representing the two logic states of the memory cell 31. In addition, FIG. 4 depicts easy axis of the free layer 3103 of the MTJ stack 31 being parallel with a long axis substantially aligned with the magnetic bit line 32 because of the shape of the MTJ stack 31. However, the easy axis of the free layer 3103 could be induced in another manner, such as due to intrinsic and/or stress anisotropy. In a preferred embodiment, the easy axis of the free layer is induced by a combination of shape, intrinsic anisotropy, and stress induced anisotropy.

Figure 5:
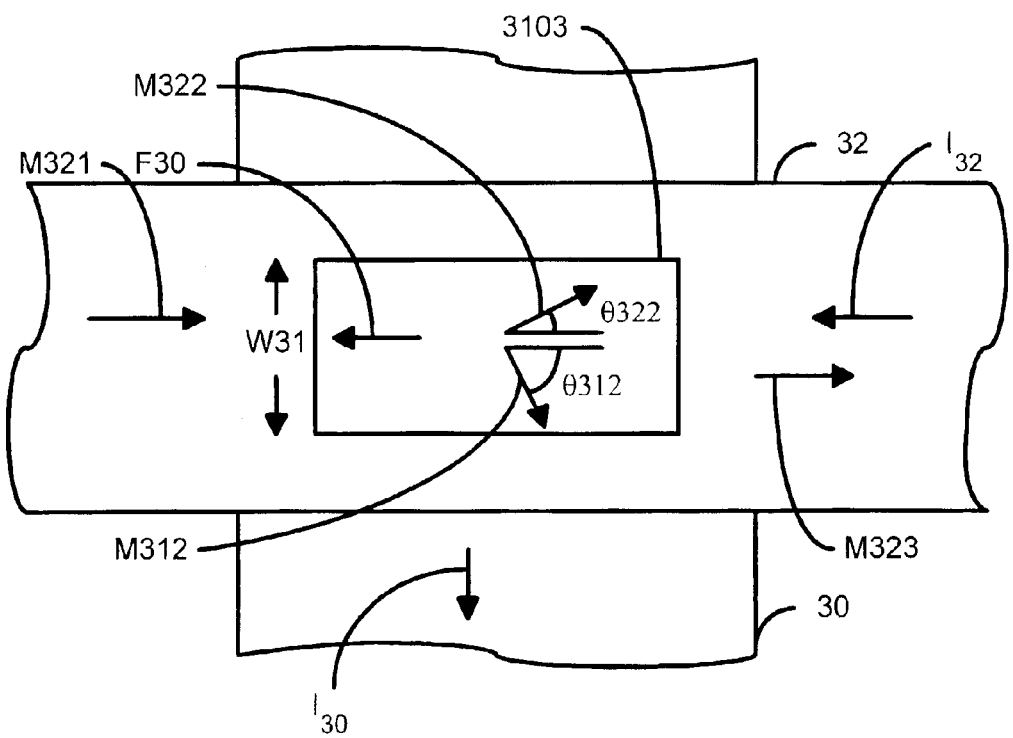
FIG. 5 is the plane view of the MTJ cell and the bit line, as well as the schematic representation of the magnetic vectors of free layer of the MTJ cell and the magnetic bit line when a write current is flowing in the bit line for one embodiment of a magnetic memory in accordance with the present invention.

FIG. 5 depicts one embodiment of the portion of the magnetic memory during writing. FIG. 5 displays the magnetic vectors of the magnetic bit line 32 and the free layer 3103, as described in FIG. 4, in the presence of a write current $I_{32}$ flowing in the magnetic bit line 32. It is assumed that the logic state corresponds to the free layer magnetic vector M312. The current $I_{32}$ induces a magnetic field that rotates the free layer magnetic vector M312 according to the right hand rule. Thus, the magnetic vector 312 of the free layer 3103 rotates down as shown in FIG. 5. Because the magnetic vector M322 of the magnetic bit line 32 is in close proximity to the free layer 31, M322 has a strong magnetostatic coupling with the free layer magnetic vector M312. As a result, M322 also rotates, up as shown in FIG. 5, to form a flux closure in the direction perpendicular to the magnetic bit line 32.

In a preferred embodiment, the magnetic moment of the magnetic bit line 32 is much greater than the magnetic moment of the free layer 3103. Preferably, this is ensured by making the thickness of the magnetic bit line 32 much greater than that of the free layer 3103. Because the moment of the magnetic bit line 32 is much greater than that of the free layer 3103, the angle of rotation, θ322, of the bit line magnetic vector M322 is much smaller than the angle of rotation, θ312, of the free layer magnetic vector M312. In a preferred embodiment, the magnetic vectors M322 of the magnetic bit line 32 thus remain substantially in the magnetic bit line 32 lengthwise direction throughout the write operation. In other words, during reversal of the free layer magnetic vector, the magnetic vector M322 of the magnetic bit line 32 only deviates from the bit line lengthwise direction by a very small angle. In a preferred embodiment, the ratio of the sine of the rotation angle θ322 of the bit line magnetic vector M322 to the sine of the rotation angle θ312 of the free layer magnetic vector M312 is roughly as follows, sin(θ322)/sin(θ312)~(total moment of the free layer 3103)/(total moment of the magnetic bit line 32).

By ensuring that the magnetic moment of the magnetic bit line 32 at least ten times that of the free layer 3103, a small rotation angle for the bit line magnetic vectors is allowed. In practice, this difference in magnetic moments is preferably achieved by providing a line thickness for the bit line 32 that is at least three hundred Angstroms or larger.

A small rotation angle θ322 for the bit line magnetic vector M322 of the magnetic bit line 32 is desired to improve the writing efficiency of the magnetic bit line 32 without compromising the writing efficiency of the word line 30. As shown in FIG. 5, the magnetic memory also includes a word line 30 that, in a preferred embodiment, runs substantially orthogonal to the magnetic bit line 32. During writing, a current $I_{30}$ flows in the word line 30 while the current $I_{32}$ flows in the magnetic bit line 32. The combination of the two currents ($I_{30}$ and $I_{32}$) and the polarity of the word line current $I_{30}$ determines the final direction of the magnetic vector (M311/M312) of the free layer 3103. Stated differently, the two currents $I_{30}$ and $I_{32}$ combine to write to the MTJ stack 31. During writing, $I_{30}$ produces a magnetic field F30 that lies substantially lengthwise, along the magnetic bit line 32. The polarity of the field F30, which is left or right as shown in FIG. 5, is determined by the polarity of $I_{30}$. The polarity of the field F30 determines the logic state to be written to the MTJ cell 31.

The field F30 produces a torque on both the bit line magnetic vector M322 and the free layer magnetic vector M312. When θ312 is much greater than θ322, the torque produced on the free layer magnetic vector M312 by magnetic field F30 is much greater than the torque on the bit line magnetic vector M322. Moreover, when θ322 is negligibly small, the torque on M322 is negligible. As a result, the bit line magnetic vector M322 remains substantially lengthwise, along the magnetic bit line 32 and flux closure is maintained. In this way, the write efficiency of the magnetic bit line 32 is greatly improved by the flux closure, while the write efficiency of the word line 30 is not compromised.

In addition to the magnetic bit line 32 having a much greater thickness than the free layer 3103, to achieve more efficient flux closure between the magnetic bit line magnetic vector M322 and the free layer magnetic vector M311/M312, the spacing between the magnetic bit line 32 and the free layer 3103 is sufficiently small. Consequently, in a preferred embodiment, the thickness of the magnetic bit line 32 is much greater than the thickness of the free layer 3103 and the spacing between the free layer 3103 and the magnetic bit line 32 is sufficiently small. However, in alternate embodiments, one or more of these features may be omitted. For example, the spacing between the magnetic bit line 32 and the free layer 3103 may be sufficiently small, but the difference between the thicknesses of the magnetic bit line 32 and the free layer 3103 may be small. An estimation of the desired spacing can be made using the conventional characteristic length for the flux closure of two magnetic layers. Because the magnetic bit line 32 is preferably much thicker than the free layer 31, the characteristic length is roughly $(\mu gt/2)^{0.5}$, where $\mu$ is the permeability of the free layer 3103, g is the spacing between the magnetic bit line 32 and the free layer 3103, and t is the thickness of the free layer 32. The width W31 of the MTJ stack 31 is preferably much larger than the characteristic length to avoid significant edge curling walls. As a result, the desired spacing can be determined from the following relationship:

$$(\mu g t/2)^{0.5} < W31$$

In today's applications, this relationship means that for the spacing to be as small as desired, the spacing should be in the order of three hundred Angstroms or less. Consequently, in a preferred embodiment, the spacing between the free layer 3103 and the magnetic bit line 32 is less than three hundred Angstroms, while the thickness of the magnetic bit line 32 is greater than three hundred Angstroms.

Figure 6:
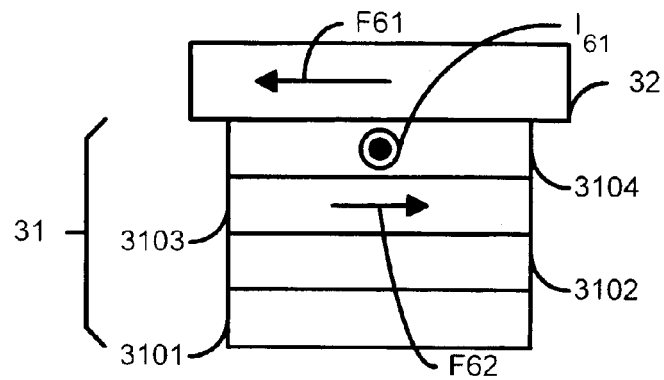
FIG. 6 is the cross-sectional view of the MTJ cell and the bit line, showing the field produced by the portion of the current in the metal spacer layer for one embodiment of a magnetic memory in accordance with the present invention.

FIG. 6 shows a cross-sectional view of one embodiment of the magnetic bit line 32 and the MTJ stack 31 as depicted in FIG. 3b. During writing, portion of the current $I_{32}$ in the magnetic bit line 32 is shunted by the metal capping layer 3104. The current in the metal capping layer $I_{61}$, produces magnetic fields, F61 and F62, in the magnetic bit line 32 and in the free layer 3103, respectively. These two magnetic fields F61 and F62 are opposite in direction, further enhancing the magnetic flux closure between the magnetic bit line 32 and the free layer 3103. Therefore, it is desirable to have high conductivity metal as the capping layer 3104 to enhance the flux closure between the free layer 3103 and the magnetic bit line 32. In a preferred embodiment, the capping layer 3104 includes gold, copper, silver, ruthenium, rhodium, aluminum, other well know good conductors, and alloys thereof.

If copper is used as the capping layer 3104, cobalt-iron (not shown) or other suitable material is usually used as a diffusion barrier between the capping layer 3104 and the free layer 3103. In such an embodiment, the free layer 3103 preferably includes a thin cobalt-iron layer (not shown) of at least several angstroms on the top to prevent the diffusion of copper into free layer 3103. This diffusion barrier may be particularly useful when nickel-iron is part of the free layer 3103. For similar reasons, a cobalt-iron layer (not shown) may be placed between the copper capping layer 3104 and the magnetic bit line 32, especially when nickel-iron is used as part of the magnetic bit line 32.

To reduce the resistance of the magnetic bit line 32, a thin layer of high conductivity non-magnetic metal (not shown) can also be placed as the seed layer (not shown) of the magnetic bit line 32. However, the thickness of this seed layer is preferably small enough that the combined thickness of the non-magnetic seed layer and the capping layer 3104 is about 300 angstrom or thinner.

Although the method and system in accordance with the present invention is described using a MTJ stack 31 with free layer 3103 on top of the thin insulator layer 3102, one of ordinary skill in the art will readily recognize that the method and system also function for other magnetic structures. Such magnetic structures include, but are not limited to, a MTJ stack (not shown) having the free layer beneath the insulator tunneling layer, and a MTJ stack (not shown) having two insulator tunneling layers and a free layer sandwiched between the two insulator layers. In each configuration, it is preferred that the spacing between the magnetic bit line and the free layer is in the order of three hundred Angstroms or less. In different configurations, this preferred thickness takes into account any layer that lies between the magnetic bit line 32 and the free layer 3103, such as a capping layer, a pinned layer, or other layers.

Furthermore, one of ordinary skill in the art will also readily recognize that the magnetic bit line need not be placed on top of the MTJ stack 31. For example, the magnetic bit line 32 can also lie beneath the MTJ structure. Nor is the electrical connection between the magnetic bit line 32 and the MTJ stack 31 required. In such an embodiment, the magnetic line may be called a write line. Moreover, in another embodiment, the write line and the bit line may both be magnetic. However, in all embodiments, it is preferred that the spacing between the magnetic write line, if any, and the free layer with the changeable magnetic vector be about three hundred Angstroms or less and that the magnetic write line thickness is greater than three hundred Angstroms.

Figure 7:
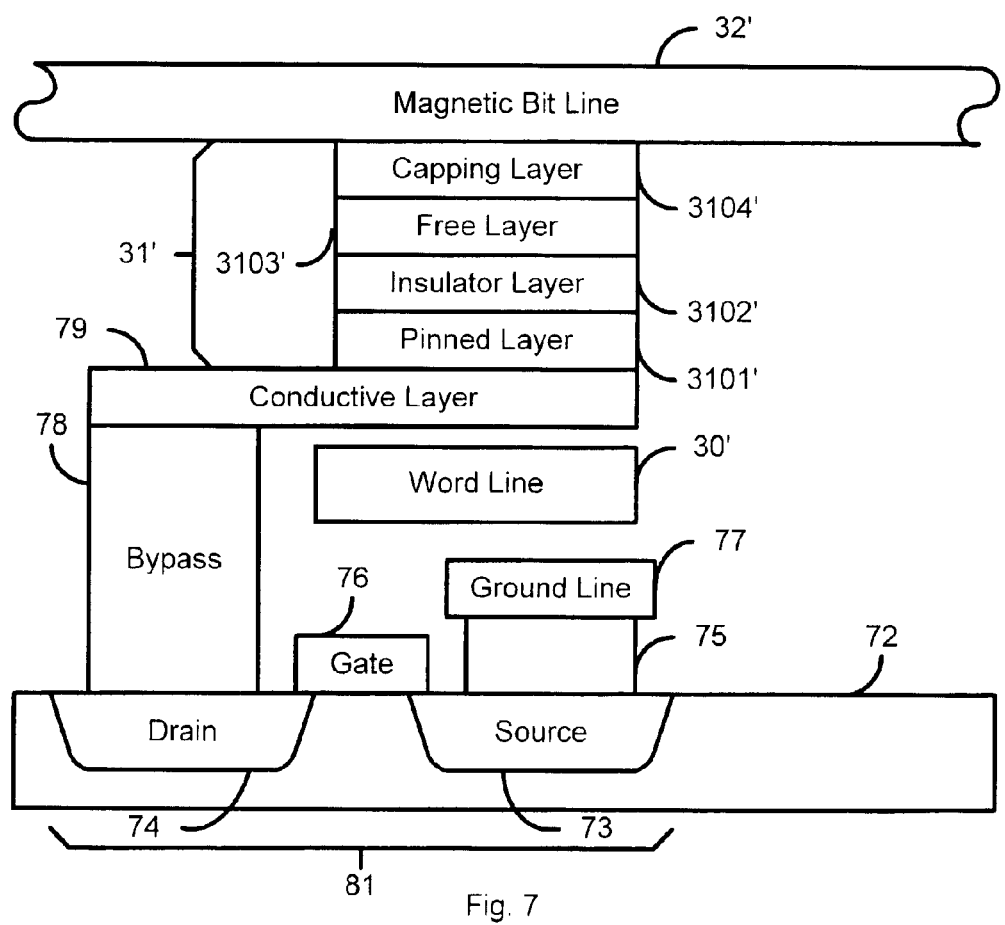
FIG. 7 is the cross-sectional view of a portion of one embodiment of a MRAM in accordance with the present invention including a memory cell.

FIG. 7 depicts one of the preferred embodiments of a portion of a MRAM memory in accordance with the present invention. Many of the components are analogous to the magnetic bit line 32, memory cell/MTJ stack 31, and word line 30 depicted in FIGS. 3a–3c, 4, 5, and 6. Consequently, many components are labeled similarly. For example, the MTJ stack 31' in FIG. 7 corresponds to the MTJ stack 31 depicted in FIGS. 3a–3c, 4, 5, and 6. Referring to FIG. 7, in addition to the magnetic bit line 32', and the MTJ stack 31' as described above, a word line 30', a by-pass connection 78, a conductive layer 79, a ground line 77, and a transistor 81 in a substrate 72 are depicted. The word line 30' is shown to run substantially orthogonal to the magnetic bit line 32'. The MTJ stack 31' is connected through a conductive layer 79 and a by-pass connection 78, to the source 74 of the transistor 81. The transistor 81 is preferably a FET transistor. The drain 73 of the FET transistor 81 is connected, through a contact 75 to the ground line 77. The gate 76 of the FET transistor 81 is connected to a read word line (not shown). Although the configuration shown is preferred, one of ordinary skill in the art will readily recognize that many other different configurations incorporating the magnetic bit lines according to the present invention are possible. For example, diode (not shown) can be used to replace the transistor 81. MRAM cells (not shown) without transistor or diodes are also possible.

Figure 8:
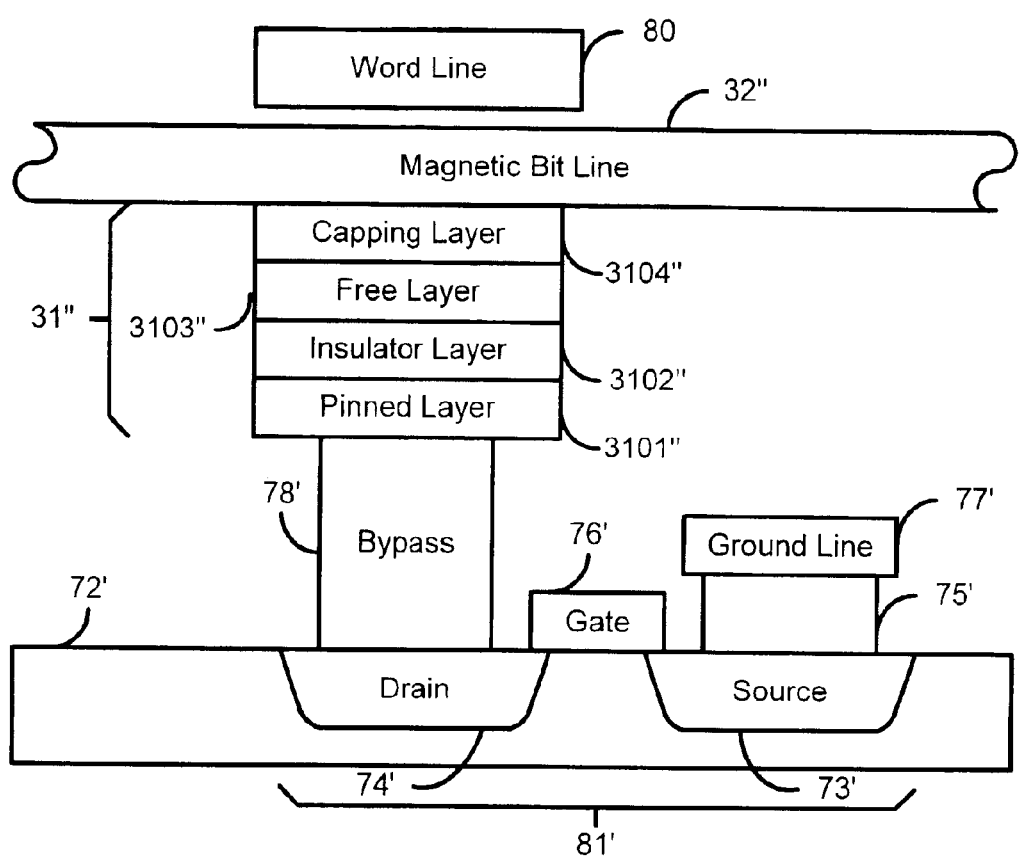
FIG. 8 is the cross-sectional view of a portion of another embodiment of a MRAM in accordance with the present invention including a memory cell.

FIG. 8 shows another preferred embodiment of a portion of an MRAM in accordance with the present invention. Many of the components are analogous to the magnetic bit line 32", memory cell/MTJ stack 31 and 31', and word line 30 and 30" depicted in FIGS. 3a–3c, 4, 5, 6, and 7. Consequently, many components are labeled similarly. For example, the MTJ stack 31" in FIG. 8 corresponds to the MTJ stack 31 and 31' depicted in FIGS. 3a–3c, 4, 5, 6, and 7. Similarly, the transistor 81' corresponds to the transistor 81 in FIG. 7. The word line 80 corresponds to the word lines 30 and 30' in FIGS. 3a–3c, 4, 5, 6, and 7. Referring to FIG. 8, the MRAM includes the magnetic bit line 32", the MTJ stack 31", the bypass connection 78', the ground line 77', and the FET 81' in the substrate 72'. The bit line 32", the MTJ 31", the FET 81', and the word read line 80 are substantially the same as described with respect to FIG. 7. However, unlike the word line 30 of FIG. 7, the word line 80' in FIG. 8 is placed above the magnetic bit line 32". To maintain the write efficiency of the word line 80', the thickness of the magnetic bit line 32" is preferably as small as possible. Making a conventional bit line this thin is difficult in normal design, where the bit line is made of aluminum or copper. However, such a small thickness is practical in the present invention.

As discussed above, conventional thin bit lines have two shortcomings. First, thinner conventional bit lines have higher resistances. This adversely affects the performance of the overall memory array. However, there are many conventional methods of overcoming this issue. One common practice is to break up the long bit lines in the memory array into global bit lines that are made of thick metals, and connect the global bit lines into local bit lines that are made of thinner metals, and thus have a higher resistance. However, such conventional methods do not use magnetic bit lines. In addition, such conventional methods still suffer from other drawbacks, such as electromigration discussed below.

Second, electromigration of conventional thin metal lines adversely affect reliability. For example, copper has a relatively low electromigration limit for current density of about $1 \times 10^6$ A/cm$^2$ or less. Aluminum lines have even lower capability to carry current without suffering adverse affects due to electromigration. In comparison, magnetic materials such as nickel-iron have much higher capability to carry current without suffering adverse effects due to electromigration. For example, nickel-iron films have been used for magneto-resistive read sensors in hard drives, and have been shown to have capability to carry current in excess of $10^8$ A/cm$^2$. That is far greater than that of aluminum and copper, and thus allows for much thinner and/or narrower bit lines.

Due to the excellent electromigration properties of soft magnetic films such as nickel-iron, it is practical to have thin bit lines in the order of several hundred angstroms. This will greatly enhance the efficiency of the word line 80. Although the word line 80 is shown as a single line in FIG. 8, it should be understood by those skilled in the art that the invention includes more efficient word line structures, such as the use of cladding layers for the word line 80.

A method and system has been disclosed for providing a magnetic memory having improved writing efficiency, better reliability, and simpler fabrication. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic memory comprising
a plurality of magnetic memory cells,
a first plurality of write lines, the first plurality of write lines being a plurality of magnetic write lines, each of the first plurality of write lines including a central portion including a center of the write line and including a magnetic material; and
a second plurality of write lines, at least one of the plurality of magnetic lines and at least one of the second plurality of write lines each carrying a current for writing to at least one of the plurality of magnetic memory cells.

2. The magnetic memory of claim 1 wherein the first plurality of write lines include a plurality of magnetic bit lines electrically connected to the plurality or magnetic memory cells.

3. The magnetic memory of claim 2 wherein the plurality of magnetic memory cells include a plurality of magnetic tunneling junction stacks, each of the plurality of magnetic tunneling junction stacks includes a free layer, an insulator layer and a pinned layer, the free layer and the pinned layer being ferromagnetic, the insulator layer residing between the free layer and a pinned layer and having a thickness that allows tunneling of charge carriers between the free layer and the pinned layer.

4. A magnetic memory comprising:
a plurality of magnetic memory cells, wherein the plurality of magnetic memory cells include a plurality of magnetic tunneling junction stacks, each of the plurality of magnetic tunneling junction stacks includes a free layer, an insulator layer and a pinned layer, the free layer and the pinned layer being ferromagnetic, the insulator layer residing between the free layer and a pinned layer and having a thickness that allows tunneling of charge carriers between the free layer and the pinned layer;
a first plurality of write lines, the first plurality of write lines being a plurality of magnetic write lines, the first plurality of write lines including a plurality of magnetic bit lines electrically connected to the plurality or magnetic memory cells; and
a second plurality of write lines, at least one of the plurality of magnetic lines and at least one of the second plurality of write lines each carrying a current for writing to at least one of the plurality of magnetic memory cells;
wherein the plurality of magnetic bit lines are separated from the free layer by less than or equal to three hundred Angstroms.

5. The magnetic memory of claim 4 wherein each of the plurality of magnetic tunneling junction stacks includes a nonmagnetic spacer layer between the free layer and a corresponding magnetic bit line, the nonmagnetic spacer layer being conductive.

6. The magnetic memory of claim 5 wherein the nonmagnetic spacer layer is a high conductivity metal.

7. The magnetic memory of claim 6 wherein the high conductivity metal includes gold, copper, aluminum, rhodium, ruthenium, tantalum, and/or an alloy thereof.

8. The magnetic memory of claim 5 wherein the nonmagnetic spacer layer includes copper, and wherein the corresponding magnetic bit line includes a diffusion barrier between the copper and a remaining portion of the corresponding magnetic write line.

9. The magnetic memory of claim 8 wherein the free layer includes a second diffusion barrier between the copper and the free layer.

10. The magnetic memory of claim 9 wherein the diffusion barrier and the second diffusion barrier include cobalt-iron.

11. A magnetic memory comprising:
a plurality of magnetic memory cells, wherein the plurality of magnetic memory cells include a plurality of magnetic tunneling junction stacks, each of the plurality of magnetic tunneling junction stacks includes a free layer, an insulator layer and a pinned layer, the free layer and the pinned layer being ferromagnetic, the insulator layer residing between the free layer and a pinned layer and having a thickness that allows tunneling of charge carriers between the free layer and the pinned layer;
a first plurality of write lines, the first plurality of write lines being a plurality of magnetic write lines, the first plurality of write lines including a plurality of magnetic bit lines electrically connected to the plurality or magnetic memory cells; and
a second plurality of write lines, at least one of the plurality of magnetic lines and at least one of the second plurality of write lines each carrying a current for writing to at least one of the plurality of magnetic memory cells
wherein the magnetic bit line has a first thickness that is greater than a second thickness of the free layer.

12. The magnetic memory of claim 11 wherein the first thickness is ten times the second thickness.

13. The magnetic memory of claim 11 wherein the first thickness is at least three hundred Angstroms.

14. The magnetic memory of claim 1 wherein the plurality of magnetic write lines include soft magnetic materials.

15. The magnetic memory of claim 14 wherein the soft magnetic materials include cobalt, nickel, iron, and/or alloys thereof.

16. A magnetic memory comprising
a plurality of magnetic memory cells,
a first plurality of write lines, the first plurality of write lines being a plurality of magnetic write lines; and
a second plurality of write lines, at least one of the plurality of magnetic lines and at least one of the second plurality of write lines each carrying a current for writing to at least one of the plurality of magnetic memory cells;
wherein the plurality of magnetic write lines includes a plurality of composite of magnetic layers.

17. A magnetic memory comprising
a plurality of magnetic memory cells,
a first plurality of write lines, the first plurality of write lines being a plurality of magnetic write lines; and
a second plurality of write lines, at least one of the plurality of magnetic lines and at least one of the second plurality of write lines each carrying a current for writing to at least one of the plurality of magnetic memory cells;
wherein each of the plurality of magnetic write lines has an easy axis substantially oriented parallel to a lengthwise direction of each of the plurality of magnetic write lines.

18. The magnetic memory of claim 5 wherein the nonmagnetic spacer layer and the corresponding write line are placed above the magnetic tunneling junction stack, and wherein the second plurality of write lines is placed above the plurality of magnetic write lines and oriented substantially orthogonal to the plurality of magnetic write lines.

19. The magnetic memory of claim 18 wherein the plurality of magnetic write lines has a thickness between three hundred Angstroms and three thousand angstroms, thereby minimizing a separation between the second plurality of write lines and the free layer.

20. The magnetic memory of claim 5 wherein the magnetic tunneling junction stack further includes a second insulator layer and a second pinned layer, the free layer sandwiched in between the insulator layer and the second insulator layer, the second insulator layer residing between the free layer and the second pinned layer.

21. A magnetic memory comprising
a plurality of magnetic memory cells,
a first plurality of write lines, the first plurality of write lines being a plurality of magnetic write lines; and
a second plurality of write lines, at least one of the plurality of magnetic lines and at least one of the second plurality of write lines each carrying a current for writing to at least one of the plurality of magnetic memory cells;
further comprising a plurality of selection devices, one of the plurality of selection devices corresponding to each of the plurality of magnetic memory cells, wherein each of the plurality of selection devices is a FET including a gate, the gate being connected to an additional read word line.

22. A magnetic memory comprising
a plurality of magnetic memory cells,
a first plurality of write lines, the first plurality of write lines being a plurality of magnetic write lines; and
a second plurality of write lines, at least one of the plurality of magnetic lines and at least one of the second plurality of write lines each carrying a current for writing to at least one of the plurality of magnetic memory cells;
further comprising a plurality of selection devices, each of the plurality of selection devices corresponding to each of the plurality of magnetic memory cells, wherein each of the plurality of selection devices is a diode.

23. A magnetic memory comprising
a plurality of magnetic memory cells,
a first plurality of write lines, the first plurality of write lines being a plurality of magnetic write lines; and
a second plurality of write lines, at least one of the plurality of magnetic lines and at least one of the second plurality of write lines each carrying a current for writing to at least one of the plurality of magnetic memory cells
wherein the second plurality of write lines are a second plurality of magnetic write lines.

24. A method for utilizing a magnetic memory comprising the steps of:
(a) in a write mode, writing to a first portion of a plurality of memory cells, the plurality of memory cells being coupled to a first plurality of write lines and a second plurality of write lines, the first plurality of write lines being a plurality of magnetic write lines, each of the first plurality of write lines including a central portion including a center of the write line and including a magnetic material, at least one of the plurality of magnetic lines and at least one of the second plurality of write lines each carrying a current for writing to at least one of the plurality of magnetic memory cells.
(b) in a read mode, reading from a second portion of the plurality of memory cells.

25. The method of claim 24 wherein the first plurality of write lines include a plurality of magnetic bit lines electrically connected to the plurality or magnetic memory cells.

26. The method of claim 25 wherein the plurality of magnetic memory cells include a plurality of magnetic tunneling junction stacks, each of the plurality of magnetic tunneling junction stacks includes a free layer, an insulator layer and a pinned layer, the free layer and the pinned layer being ferromagnetic, the insulator layer residing between the free layer and a pinned layer and having a thickness that allows tunneling of charge carriers between the free layer and the pinned layer.

27. A method for utilizing a magnetic memory comprising:
in a write mode, writing to a first portion of a plurality of memory cells, the plurality of memory cells being coupled to a first plurality of write lines and a second plurality of write lines, the first plurality of write lines being a plurality of magnetic write lines, the first plurality of write lines including a plurality of magnetic bit lines electrically connected to the plurality or magnetic memory cells, at least one of the plurality of magnetic lines and at least one of the second plurality of write lines each carrying a current for writing to at least one of the plurality of magnetic memory cells, the plurality of magnetic memory cells including a plurality of magnetic tunneling junction stacks, each of the plurality of magnetic tunneling junction stacks includes a free layer, an insulator layer and a pinned layer, the free layer and the pinned layer being ferromagnetic, the insulator layer residing between the free layer and a pinned layer and having a thickness that allows tunneling of charge carriers between the free layer and the pinned layer;

in a read mode, reading from a second portion of the plurality of memory cells;

wherein the plurality of magnetic bit lines are separated from the free layer by less than or equal to three hundred Angstroms.

28. The method of claim 27 wherein each of the plurality of magnetic tunneling junction stacks includes a nonmagnetic spacer layer between the free layer and a corresponding magnetic bit line, the nonmagnetic spacer layer being conductive.

29. The method of claim 28 wherein the nonmagnetic spacer layer is a high conductivity metal.

30. The method of claim 28 wherein the nonmagnetic spacer layer includes copper, and wherein the corresponding magnetic bit line includes a diffusion barrier between the copper and a remaining portion of the corresponding magnetic write line.

31. The method of claim 30 wherein the free layer includes a second diffusion barrier between the copper and the free layer.

32. A method for utilizing a magnetic memory comprising:

in a write mode, writing to a first portion of a plurality of memory cells, the plurality of memory cells being coupled to a first plurality of write lines and a second plurality of write lines, the first plurality of write lines being a plurality of magnetic write lines, the first plurality of write lines including a plurality of magnetic bit lines electrically connected to the plurality or magnetic memory cells, at least one of the plurality of magnetic lines and at least one of the second plurality of write lines each carrying a current for writing to at least one of the plurality of magnetic memory cells, the plurality of magnetic memory cells including a plurality of magnetic tunneling junction stacks, each of the plurality of magnetic tunneling junction stacks includes a free layer, an insulator layer and a pinned layer, the free layer and the pinned layer being ferromagnetic, the insulator layer residing between the free layer and a pinned layer and having a thickness that allows tunneling of charge carriers between the free layer and the pinned layer;

in a read mode, reading from a second portion of the plurality of memory cells;

wherein the magnetic bit line has a first thickness that is greater than a second thickness of the free layer.

33. The method of claim 32 wherein the first thickness is at least three hundred Angstroms.

34. The method of claim 24 wherein the plurality of magnetic write lines include soft magnetic materials.

35. A method for utilizing a magnetic memory comprising:

in a write mode, writing to a first portion of a plurality of memory cells, the plurality of memory cells being coupled to a first plurality of write lines and a second plurality of write lines, the first plurality of write lines being a plurality of magnetic write lines, at least one of the plurality of magnetic lines and at least one of the second plurality of write lines each carrying a current for writing to at least one of the plurality of magnetic memory cells, in a read mode, reading from a second portion of the plurality of memory cells;

wherein the plurality of magnetic write lines includes a plurality of composite of magnetic layers.

36. A method for utilizing a magnetic memory comprising:

in a write mode, writing to a first portion of a plurality of memory cells, the plurality of memory cells being coupled to a first plurality of write lines and a second plurality of write lines, the first plurality of write lines being a plurality of magnetic write lines, at least one of the plurality of magnetic lines and at least one of the second plurality of write lines each carrying a current for writing to at least one of the plurality of magnetic memory cells, in a read mode, reading from a second portion of the plurality of memory cells wherein each of the plurality of magnetic write lines has an easy axis substantially oriented parallel to a lengthwise direction of each of the plurality of magnetic write lines.

37. The method of claim 24 wherein the second plurality of write lines is a second plurality of magnetic write lines.

* * * * *